(12) United States Patent
Chen et al.

(10) Patent No.: US 8,603,860 B2
(45) Date of Patent: Dec. 10, 2013

(54) PROCESS FOR FORMING PACKAGES

(75) Inventors: Meng-Tse Chen, Changzhi Township (TW); Kuei-Wei Huang, Hsin-Chu (TW); Wei-Hung Lin, Xinfeng Township (TW); Wen-Hsiung Lu, Jhonghe (TW); Ming-Da Cheng, Jhubei (TW); Chung-Shi Liu, Hsin-Chu (TW)

(73) Assignee: Taiwan Semiconductor Manufacturing Company, L.L.C., Hsin-Chu (TW)

( * ) Notice: Subject to any disclaimer, the term of this patent is extended or adjusted under 35 U.S.C. 154(b) by 136 days.

(21) Appl. No.: 13/280,163

(22) Filed: Oct. 24, 2011

(65) Prior Publication Data

US 2013/0102112 A1 Apr. 25, 2013

(51) Int. Cl.
*H01L 21/44* (2006.01)
*H01L 21/48* (2006.01)
*H01L 21/50* (2006.01)

(52) U.S. Cl.
USPC .................. 438/106; 438/121; 257/E21.499

(58) Field of Classification Search
USPC ........... 438/106, 109, 121, 125; 257/E21.499
See application file for complete search history.

(56) References Cited

U.S. PATENT DOCUMENTS 6,750,551 B1 * 6/2004 Frutschy et al. .............. 257/785

* cited by examiner

*Primary Examiner* — Hoai V Pham
(74) *Attorney, Agent, or Firm* — Slater & Matsil, L.L.P.

(57) ABSTRACT

A method includes loading a first package component on a concave boat, and placing a second package component over the first package component. A load clamp is placed over the second package component, wherein the load clamp is supported by a temperature-variable spacer of the concave boat. A reflow step is performed to bond the second package component to the first package component. During a temperature-elevation step of the reflow step, the temperature-variable spacer is softened in response to an increase in temperature, and a height of the softened temperature-variable spacer is reduced, until the load clamp is stopped by a rigid spacer of the concave boat.

20 Claims, 6 Drawing Sheets

PROCESS FOR FORMING PACKAGES

BACKGROUND

In integrated circuit formation processes, semiconductor wafers are formed first, with semiconductor devices formed therein. The dies in the semiconductor wafers need to be packaged before they can be used. The dies may be bonded to other package components such as device dies, interposers, package substrates, printed circuit boards (PCBs) to form packages.

In addition, package-on-package (POP) structures may be formed. In a PoP structure, a top package, in which a device die is bonded, is bonded to a bottom package. The bottom package may also have a device die packaged therein. By adopting the PoP process, the integration level of the packages may be increased.

Since the materials in the package components have different coefficients of thermal expansion (CTEs), the package components may have a warpage during and after the packaging processes. The warpage may cause cold joints, and the failure of the packages.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A package and the method of forming the same are provided in accordance with various embodiments. The intermediate stages of forming the packages are illustrated. The variations of the embodiments are discussed. Throughout the various views and illustrative embodiments, like reference numbers are used to designate like elements.

Figure 1:
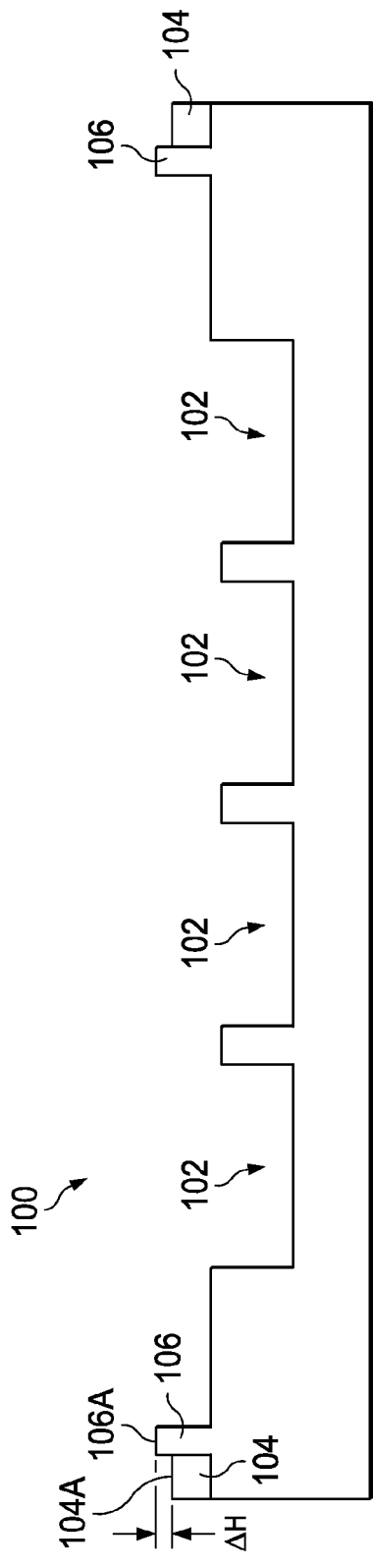
FIGS. 1 through 6 are cross-sectional views of intermediate stages in the manufacturing of a chip-scale package in accordance with various embodiments.

Referring to FIG. 1, concave boat 100 is illustrated. Concave boat 100 includes a plurality of concavities 102, which may be arranged as an array in a top view of concave boat 100. Each of concavities 102 may have a chip size for placing a chip-sized package component therein, although it may have a greater size, for example, for fitting a plurality of package components joined together as one piece.

Concave boat 100 includes rigid spacers 104 and temperature-variable spacers 106. Although in the cross-sectional view, rigid spacers 104 and temperature-variable spacers 106 are shown as being placed close to the opposite ends of concave boat 100, rigid spacers 104 and temperature-variable spacers 106 may be disposed in the peripheral regions of concave boat 100. Rigid spacers 104 may form an enclosed first ring, and temperature-variable spacers 106 may form a second enclosed ring, with both the first and the second rings encircling concavities 102. Alternatively, each of rigid spacers 104 and temperature-variable spacers 106 may include a plurality of separated pieces disposed in the peripheral regions. Rigid spacers 104 may be formed of metals, ceramics, or other materials that remain to be rigid in the subsequently performed reflow process. Temperature-variable spacers 106 may be formed of a material that is rigid at loading temperatures (the temperatures when package components 20 are placed into concavities 102 (please refer to FIG. 2)). The loading temperatures may be close to the room temperature. Temperature-variable spacers 106 may be softened, but not molten, at soldering temperatures (melting temperatures $T_{melt}$), and remain to be soft at temperatures higher than melting temperatures $T_{melt}$ of connector 32. The temperature that temperature-variable spacers 106 starts to become soft may be in the range between about ($T_{melt}$−20° C.) and about ($T_{melt}$+20° C.), or may be in the range between ($T_{melt}$−10° C.) and about ($T_{melt}$+10° C.). At a temperature that connector 32 is fully molten, temperature-variable spacers 106 are soft. For example, if connector 32 (not shown in FIG. 1, please refer to FIG. 3) is a lead-free solder that has a melting temperature (soldering temperature) between about 217 and about 230° C., temperature-variable spacers 106 may be softened at temperatures higher than 217° C. On the other hand, at lower temperatures, for example, when the temperature is lower than about $T_{melt}$−20° C., temperature-variable spacers 106 are rigid. In some embodiments, temperature-variable spacers 106 may be formed of rubber, silicone, Teflon, or combinations thereof. Top surfaces 106A of temperature-variable spacers 106 are higher than top surface 104A of rigid spacers 104, with height difference ΔH greater than, for example, about 5 mm.

Figure 2:
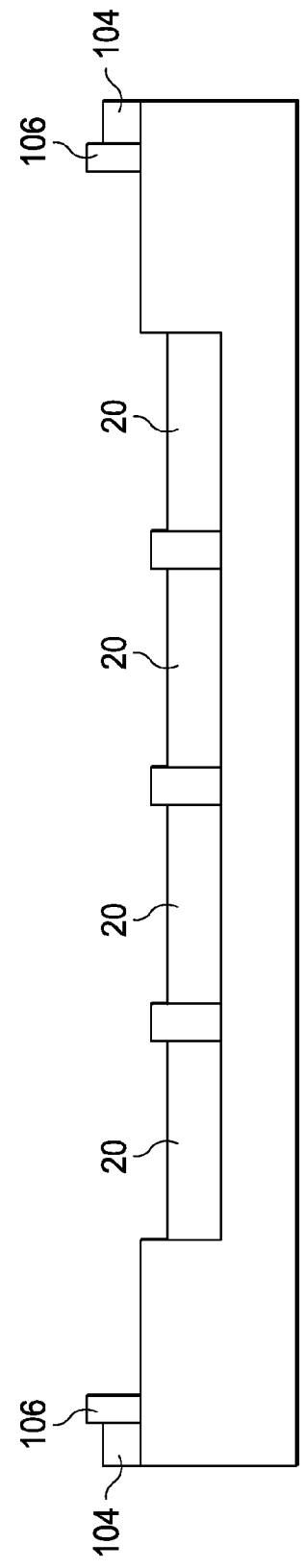

Referring to FIG. 2, package components 20 are placed into concavities 102. In some embodiments, package components 20 may be interposers, package substrates, device dies, or the like. In alternative embodiments, package components 20 may be packages, with each of the package components 20 including at least two of package components selected from a device die, a package substrate, an interposer, and the like, bonded together. In an exemplary embodiment, package components 20 include device dies (not shown) bonded to package substrates (not shown). The sizes of concavities 102 are designed to fit package components 20 so that package components 20 do not shift in the bonding process.

Figure 3:
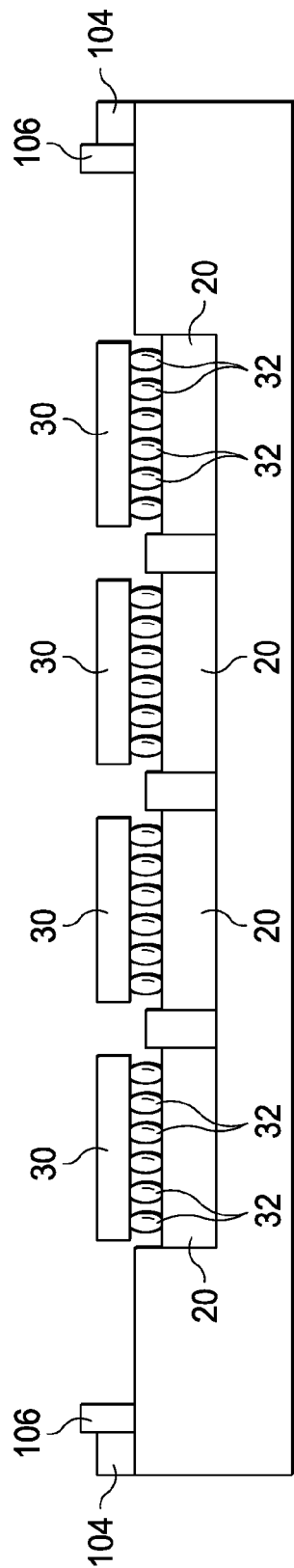

In FIG. 3, package components 30 are placed onto package components 20, for example, with a one-to-one correspondence. Connectors 32 are located between package components 20 and package components 30, and are used to electrically couple package components 20 to package components 30. In some embodiments, connectors 32 are solder balls. In alternative embodiments, connectors 32 may include metal pillars in addition to solder caps. During the placement of package components 30, package components 30 may be slightly pressed against package components 20, so that package components 30 do not shift. Also, during this step, no reflow is performed, and concave boat 100, package components 20, and package components 30 may be at a non-elevated temperature, which may be the room temperature, for example.

Figure 4:
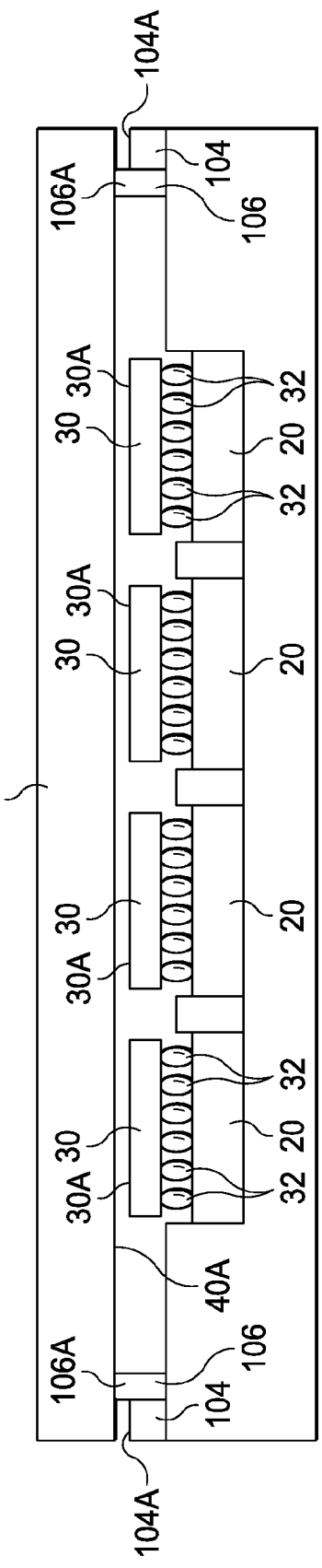

Referring to FIG. 4, load clamp 40 is placed on the structure shown in FIG. 3. The size of load clamp 40 is larger than the size of the region defined by rigid spacers 104, and larger than the size of the region defined by temperature-variable spacers 106. Also, temperature-variable spacers 106 and rigid spacers 104 are disposed in such a way that when load clamp 40 falls on either one of temperature-variable spacers 106 and rigid spacers 104, the bottom surface 40A of load clamp 40 is parallel to major surfaces of package components 20 and 30 (such as top surfaces 30A of package components 30). Load clamp 40 may be formed of metals, ceramics, or the like. The bottom surface 40A of load clamp 40 is in contact with top surfaces 106A of temperature-variable spacers 106. At the non-elevated temperature, temperature-variable spacers 106 are not softened, and are able to support load clamp 40. Accordingly, bottom surface 40A of load clamp 40 is at least level with, and may be spaced apart from, top surfaces 30A of package components 30. At the non-elevated temperature, load clamp 40 may, or may not, apply a downward force to package components 30 and 20.

Figure 5:
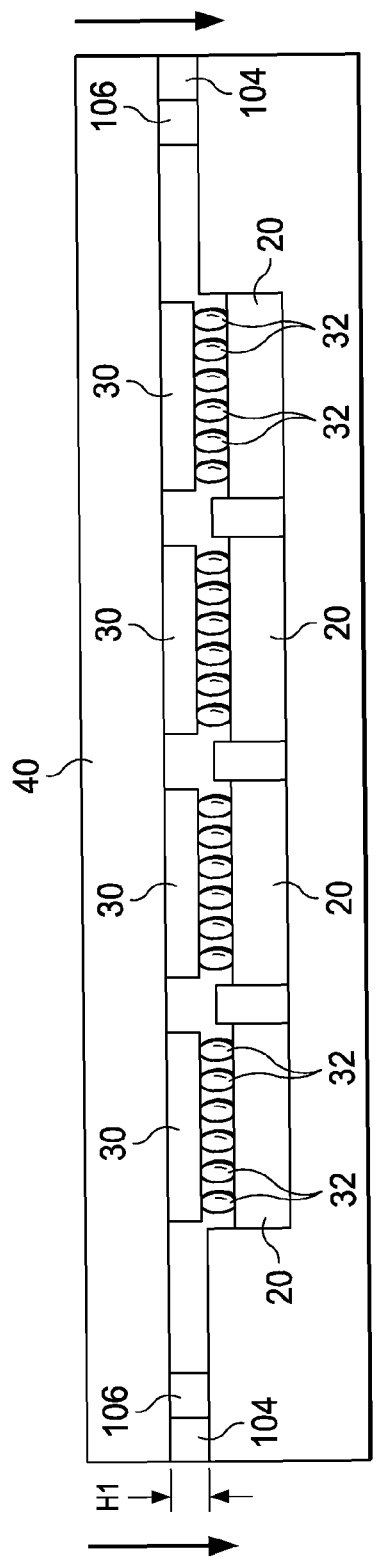

FIG. 5 illustrates a temperature elevation process, which is a part of the reflow process for bonding package components 30 to package components 20. Concave boat 100 and package components 20 and 30 placed thereon are heated, for example, in a convection reflow oven. The solder in connectors 32 are reflowed. During this process, temperature-variable spacers 106 are softened as a result of the elevated temperature, and hence the weight of load clamp 40 causes temperature-variable spacers 106 to be flattened, until load clamp 40 is stopped and supported by rigid spacers 104. Before temperature-variable spacers 106 are stopped by rigid spacers 104, bottom surface 40A of load clamp 40 starts to be in contact with top surfaces 30A of package components 30. Height H1 of rigid spacers 104 are selected so that in the subsequent bonding process, load clamp 40 may press on package components 30. As a result, package components 20 and 30 may receive the weight of load clamp 40, and hence the warpage of package components 20 and 30 may be reduced. On the other hand, height H1 of rigid spacers 104 is also great enough so that electrical connectors 32 have a desirable height when molten, and are not crushed during the reflow process. Accordingly, height H1 of rigid spacers 104 may be adjusted based on the thicknesses of package components 20 and 30 and the desirable height of connectors 32 after the reflow process. During the reflow process, there may be no additional force applied on load clamp 40 to push load clamp up or down.

Figure 6:
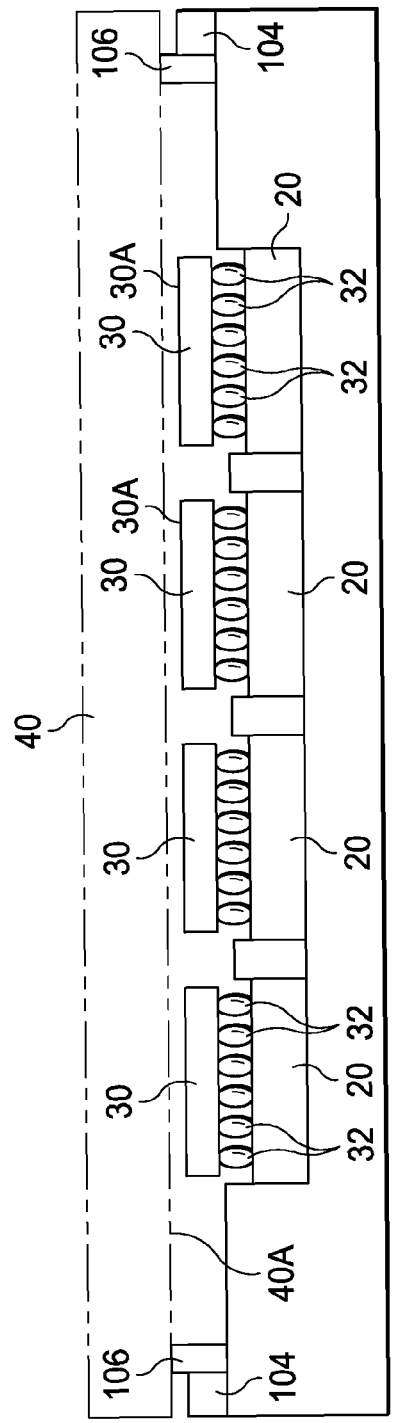

Next, as shown in FIG. 6, the temperature is lowered in a temperature-lowering step, which is also a part of the reflow process. During the temperature-lowering step, load clamp 40 may remain to be over rigid spacers 104 and temperature-variable spacers 106. With the lowering of the temperature, temperature-variable spacers 106 are hardened and become increasingly more rigid, and restore their shapes as they have before the reflow process. Accordingly, load clamp 40 is pushed up by temperature-variable spacers 106, and bottom surface 40A of load clamp 40 is again spaced apart from top surfaces 30A of package components 30 and rigid spacers 104. Load clamp 40 may then be removed at a low temperature, for example, the room temperature.

FIGS. 6 through 12 illustrate cross-sectional views of intermediate stages in the formation of a package in accordance with alternative embodiments. These embodiments are similar to the embodiments shown in FIGS. 1 through 6, except the bonding is performed at the wafer level rather than at the chip level as in FIGS. 1 through 6. Unless specified otherwise, the materials and formation methods of the components in these embodiments are essentially the same as the like components, which are denoted by like reference numerals in the embodiment shown in FIGS. 1 through 6.

Figure 7:
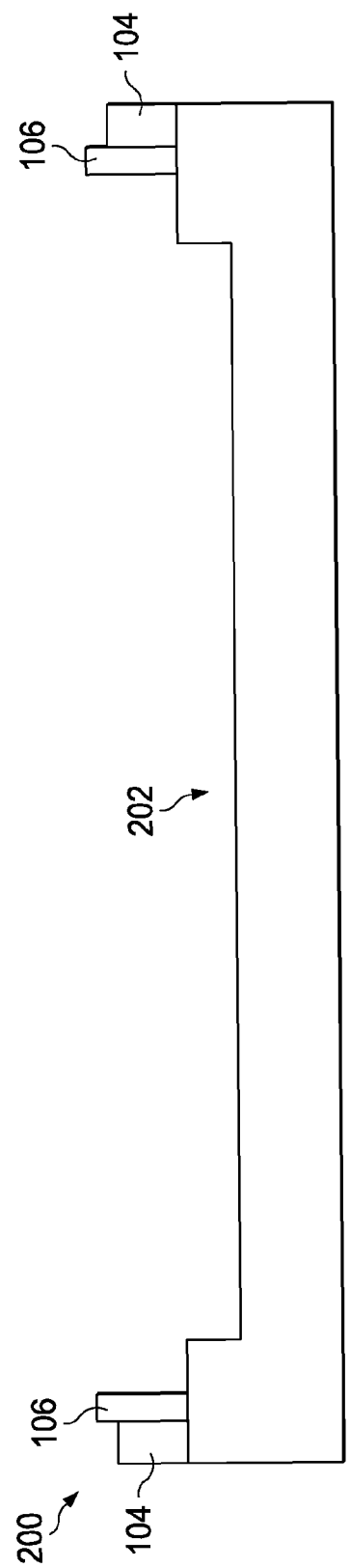
FIGS. 7 through 12 are cross-sectional views of intermediate stages in the manufacturing of a wafer-scale package in accordance with alternative embodiments.

Referring to FIG. 7, concave boat 200 is provided. Concave boat 200 is similar to concave boat 100 as in FIG. 1, except concavity 202 is larger. In an embodiment, there may be only one concavity 202 in concave boat 200. Concavity 202 may have a size large enough to fit a package substrate strip, which includes a plurality of package substrates therein. Alternatively, concavity 202 may have a round top-view shape for fitting a wafer or a wafer-level package that has a top-view size of a wafer. Rigid spacers 104 and temperature-variable spacers 106 are also included in concave boat 200, and are disposed in the peripheral regions of concave boat 200.

Figure 8:
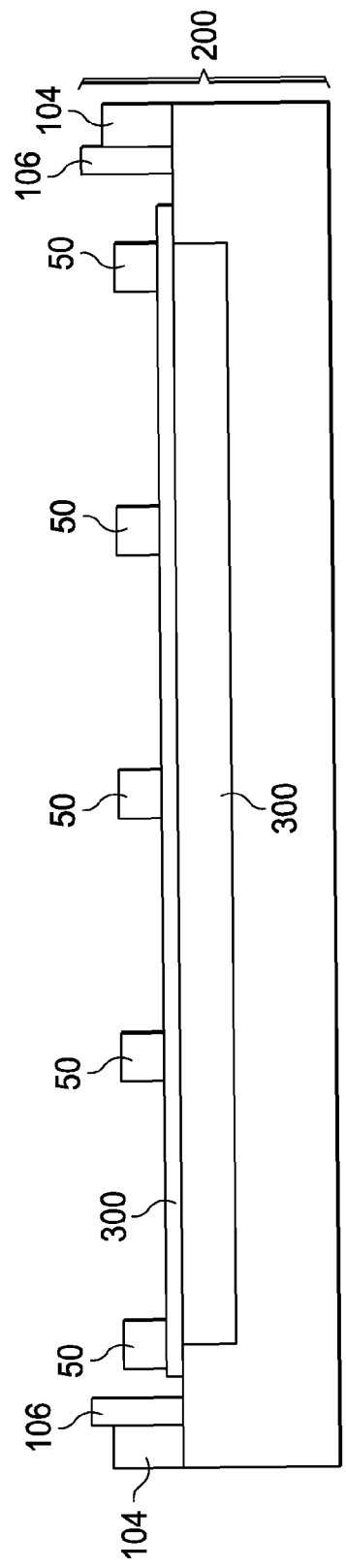

In FIG. 8, package component 300 is placed in concavity 202. Package component 300 may be a package substrate strip, and hence is referred to as package substrate strip 300 hereinafter, although package component 300 may also be wafer, a wafer-level package, a wafer-level interposer, or the like. Jig 50, which may be a magnetic jig, is placed on package substrate strip 300. Jig 50 is used for pressing down package substrate strip 300 to reduce the warpage of package substrate strip 300. Jig 50 may include a plurality of portions for pressing middle portions of package substrate strip 300 against the bottom portion of concave boat 200.

Figure 9:
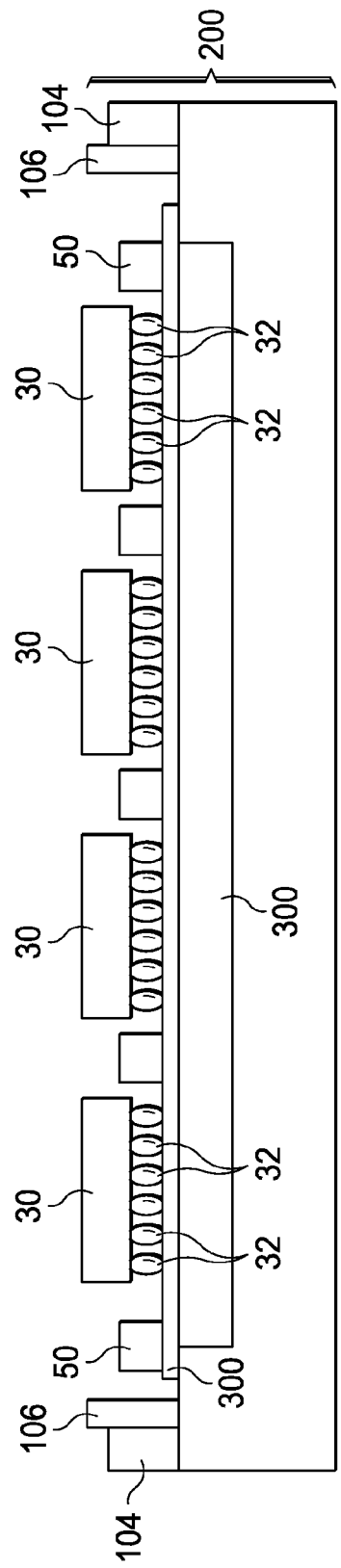
Figure 10:
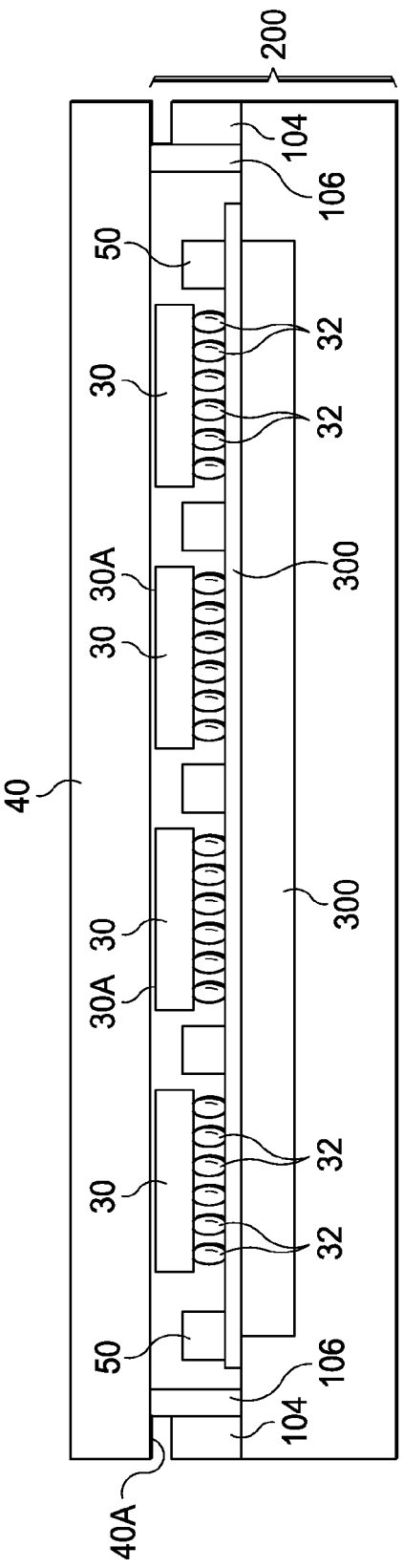

In FIG. 9, package components 30 are placed over package substrate strip 300, with connectors 32, which may comprise solder, disposed therebetween. Connectors 32 electrically couple the features in package components 30 to the features in package substrate strip 300. Next, as shown in FIG. 10, load clamp 40 is placed on temperature-variable spacers 106, and bottom surface 40A of load clamp 40 may be spaced apart from top surfaces 30A of package components 30. Bottom surface 40A of load clamp 40 may also be in contact and press on top surfaces 30A of package components 30.

Figure 11:
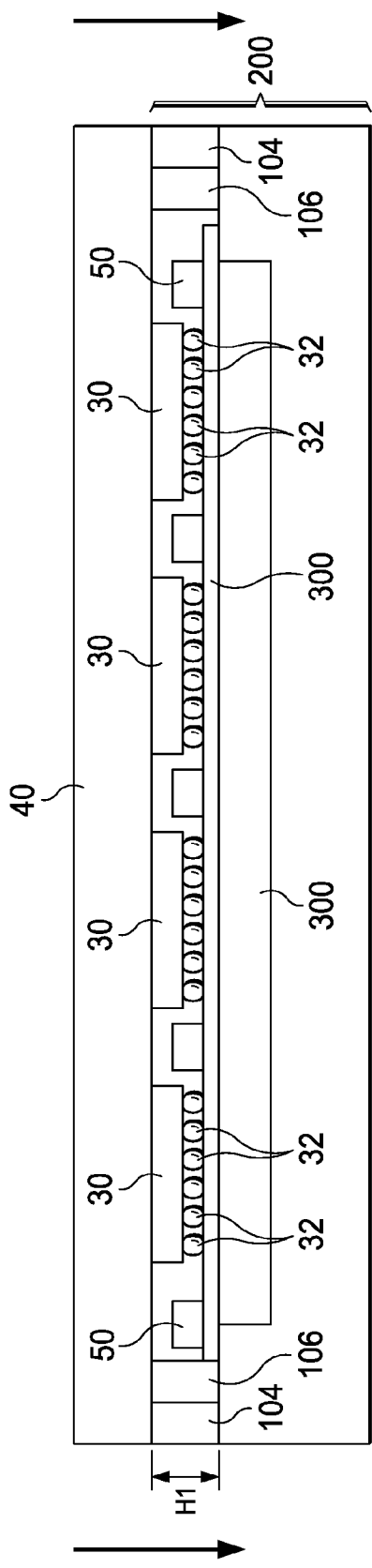

FIG. 11 illustrates the reflow of connectors 32. In the reflow process, temperature-variable spacers 106 are softened, and hence the weight of load clamp 40 causes temperature-variable spacers 106 to be flattened, until load clamp 40 falls on, and is supported by, rigid spacers 104. During the reflow, package components 20 and 30 may receive the force caused by the weight of load clamp 40, and hence the warpage of package components 30 and package substrate strip 300 may be reduced. Height H1 of rigid spacers 104 is great enough so that connectors 32 have a desirable height, and are not crushed during the reflow process. Accordingly, height H1 of rigid spacers 104 may be adjusted based on the thicknesses of package components 30, the thickness of package substrate strip 300, and the desirable height of connectors 32.

Figure 12:
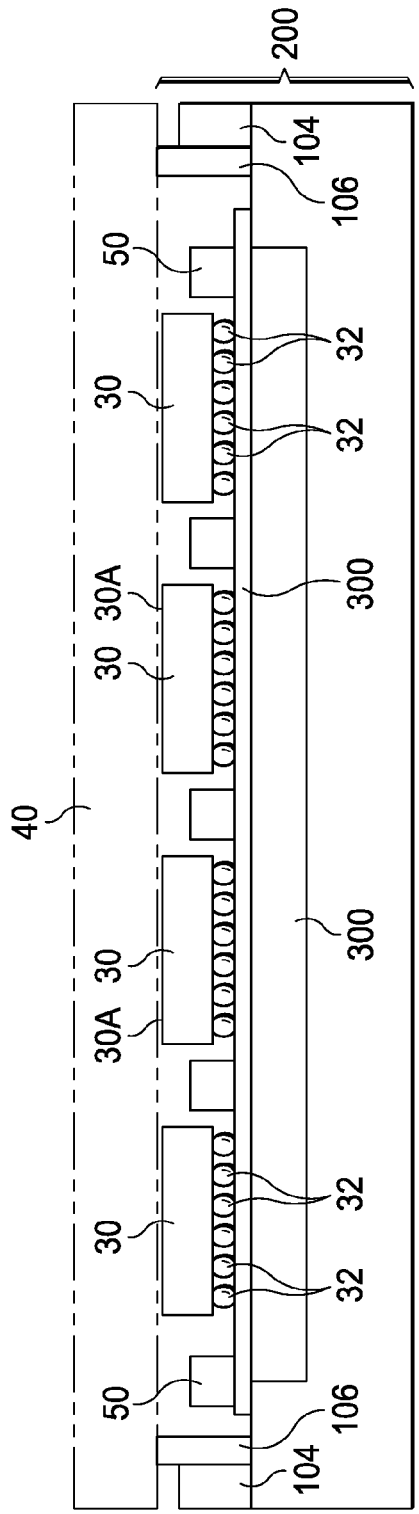

Next, as shown in FIG. 12, a temperature-lowering step is performed as a part of the reflow process. During the temperature-lowering step, load clamp 40 may remain disposed over rigid spacers 104 and temperature-variable spacers 106. With the lowering of the temperature, temperature-variable spacers 106 may become increasingly more rigid, and restore their shapes as before the reflow process. Accordingly, load clamp 40 is pushed up by temperature-variable spacers 106, and bottom surface 40A of load clamp 40 is again spaced apart from top surfaces 30A of package components 30 and rigid spacers 104. Load clamp 40 may then be removed at a low temperature, for example, the room temperature.

In the embodiments, by using temperature-variable spacers 106 and rigid spacers 104 to support the weight of load clamp 40 during the reflow process, the bonded package components may be pressed, and hence the warpage of the resulting package is reduced. In addition, the height of the solder regions in the resulting package is controlled so that no solder crushing is resulted.

In accordance with embodiments, a method includes loading a first package component on a concave boat, and placing a second package component over the first package component. A load clamp is placed over the second package component, wherein the load clamp is supported by a temperature-variable spacer of the concave boat. A reflow step is performed to bond the second package component to the first package component. During a temperature-elevation step of the reflow step, the temperature-variable spacer is softened in response to an increase in temperature, and a height of the softened temperature-variable spacer is reduced, until the load clamp is stopped by a rigid spacer of the concave boat.

In accordance with other embodiments, a first package component is loaded on a concave boat. The concave boat includes a rigid spacer, and a temperature-variable spacer having a top surface higher than a top surface of the rigid spacer. The temperature-variable spacer is configured to be softened at temperatures higher than an elevated temperature, and hardened at temperatures lower than the elevated temperature. A second package component is placed over the first package component. A load clamp is placed on the temperature-variable spacer, wherein a bottom surface of the load clamp is over and spaced apart from a top surface of the second package component. A reflow step is performed to bond the first and the second package components. During the reflow step, the load clamp remains to be over the second package component.

In accordance with yet other embodiments, a concave boat has a concavity, and includes a rigid spacer comprising a plurality of portions in peripheral regions of the concave boat, with the peripheral regions being located on outer sides of the concavity. The concave boat further includes a temperature-variable spacer comprising a plurality of portions in the peripheral regions of the concave boat. The temperature-variable spacer has a top surface higher than a top surface of the rigid spacer. The temperature-variable spacer is configured to be softened at temperatures over an elevated temperature, and hardened at temperatures lower than the elevated temperature.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    loading a first package component on a concave boat;
    placing a second package component over the first package component;
    placing a load clamp over the second package component, wherein the load clamp is supported by a temperature-variable spacer of the concave boat; and
    performing a reflow step to bond the second package component to the first package component, wherein during a temperature-elevation step of the reflow step, the temperature-variable spacer is softened in response to an increase in temperature, and wherein a height of the softened temperature-variable spacer is reduced, until the load clamp is stopped by a rigid spacer of the concave boat.

2. The method of claim 1, wherein the reflow step further comprises a temperature-lowering step, and wherein during the temperature-lowering step, the temperature-variable spacer is hardened, and raises the load clamp up from the rigid spacer.

3. The method of claim 1 further comprising removing the load clamp from over the concave boat after a temperature of the concave boat is lowered, and a top surface of the temperature-variable spacer is higher than a top surface of the rigid spacer.

4. The method of claim 1, wherein during the reflow step, no additional force is applied on the load clamp to push the load clamp down.

5. The method of claim 1, wherein the load clamp is formed of a material configure to be softened and not melted at temperatures of the reflow step.

6. The method of claim 1, wherein after the step of placing the load clamp over the second package component and before the reflow step, a bottom surface of the load clamp is over and spaced apart from a top surface of the second package component.

7. The method of claim 1, wherein during the reflow step, the load clamp applies a downward force on the first and the second package components.

8. A method comprising:
    loading a first package component on a concave boat, wherein the concave boat comprises:
        a rigid spacer; and
        a temperature-variable spacer having a top surface higher than a top surface of the rigid spacer;
    placing a second package component over the first package component;
    placing a load clamp on the temperature-variable spacer, wherein a bottom surface of the load clamp is over and spaced apart from a top surface of the second package component; and
    performing a reflow step to bond the first and the second package components, wherein during the reflow step, the load clamp remains to be over the second package component, wherein the temperature-variable spacer is configured to start soften at a temperature lower than a melting temperature of a solder region between the first and the second package components.

9. The method of claim 8, wherein the reflow step comprises a temperature-elevation step, and wherein during the temperature-elevation step, a height of the temperature-variable spacer is reduced in response to an increase in reflow temperature, until the load clamp is stopped by the rigid spacer, and wherein a bottom surface of the load clamp is in contact with the second package component before the load clamp is stopped by the rigid spacer.

10. The method of claim 9, wherein the reflow step further comprises a temperature-lowering step after the temperature-elevation step, and wherein during the temperature-lowering step, the temperature-variable spacer restores shape to push the load clamp up and away from the second package component and the rigid spacer.

11. The method of claim 8 further comprising removing the load clamp from over the concave boat after the reflow step, wherein the step of removing the load clamp is performed at a time when a temperature of the concave boat is close to a room temperature.

12. The method of claim 8, wherein during the reflow step, no additional force is applied on the load clamp to push the load clamp down.

13. The method of claim 8 further comprising:
loading a plurality of first package components on the concave boat, wherein the plurality of first package components and the first package component are discrete components not joined with each other; and
before the reflow step, placing a plurality of second package components on the plurality of first package components, wherein a bottom surface of the load clamp is in contact with top surfaces of the plurality of second package components during the reflow step.

14. The method of claim 8 further comprising, before the reflow step, placing a plurality of second package components on the first package component, wherein a bottom surface of the load clamp is in contact with top surfaces of the plurality of second package components during the reflow step.

15. A method comprising:
loading a first package component on a concave boat;
placing a second package component over the first package component;
performing a reflow step to bond the first package component to the second package component, wherein during the reflow step, a constant force is applied to press the second package component against the first package component; and
stopping an application of the constant force using a stopper.

16. The method of claim 15, wherein the constant force is applied by applying a weight of a load clamp onto the second package component.

17. The method of claim 16, wherein the concave boat comprises:
a rigid spacer acting as the stopper; and
a temperature-variable spacer having a top surface higher than a top surface of the rigid spacer, and wherein before the reflow step, the load clamp is placed on, and stopped by, the temperature-variable spacer, and wherein during a temperature elevation process of the reflow step, a height of the temperature-variable spacer reduces until the load clamp is stopped by the rigid spacer.

18. The method of claim 17, wherein during a temperature reduction process of the reflow step, the load clamp is pushed up by the temperature-variable spacer.

19. The method of claim 15 further comprising, during a temperature reduction process of the reflow step, re-applying the constant force.

20. The method of claim 15, wherein the stopping the application of the constant force using the stopper is performed during the reflow step.

* * * * *